United States Patent [19]
Hollenbeck et al.

[11] Patent Number: 5,111,476
[45] Date of Patent: May 5, 1992

[54] METHOD AND APPARATUS FOR ALIGNING A LASER DIODE, AND LASER DIODE SYSTEM PRODUCED THEREBY

[75] Inventors: William E. Hollenbeck; Timothy P. Foster, both of Grants Pass; Adam J. Reed, Ashland, all of Oreg.

[73] Assignee: Applied Laser Systems, Grants Pass, Oreg.

[21] Appl. No.: 659,494

[22] Filed: Feb. 21, 1991

[51] Int. Cl.$^5$ ............................................. H01S 3/08
[52] U.S. Cl. .................................. 372/107; 372/108
[58] Field of Search ............... 373/107, 108, 109, 100

[56] References Cited

U.S. PATENT DOCUMENTS

| | | | |
|---|---|---|---|
| 4,615,031 | 9/1986 | Eales et al. | 372/36 |
| 4,916,713 | 4/1990 | Gerber | 372/109 |
| 4,918,702 | 4/1990 | Kimura | 372/108 |
| 4,991,183 | 2/1991 | Meyers | 372/100 |

*Primary Examiner*—Léon Scott, Jr.
*Attorney, Agent, or Firm*—William S. Lovell; Alexander C. Johnson, Jr.

[57] ABSTRACT

A method and apparatus are provided for mounting a laser diode in an existing TO-5 structure within a cylindrical heat sink so that the laser beam can be focused, aimed and collimated in a mechanically repeatable manner in about 45 seconds. The basis for so doing lies in the use of an alignment apparatus to align the beam of a laser diode within its TO-5 heat sink structure with a lens that has been placed within a second heat sink, and thereby to form an aimed laser optic system (ALOS). The apparatus is constructed using processes that leave several compressive forces acting within itself, whereby the structure is constrained to adopt configurations that are essentially identical upon each installation of a laser diode. An interference fit of the TO-5 heat sink flange against the second heat sink provides an additional degree of heat sinking, thereby permitting the diode to be operated at temperatures of up to 130 deg. F. without damage.

19 Claims, 10 Drawing Sheets

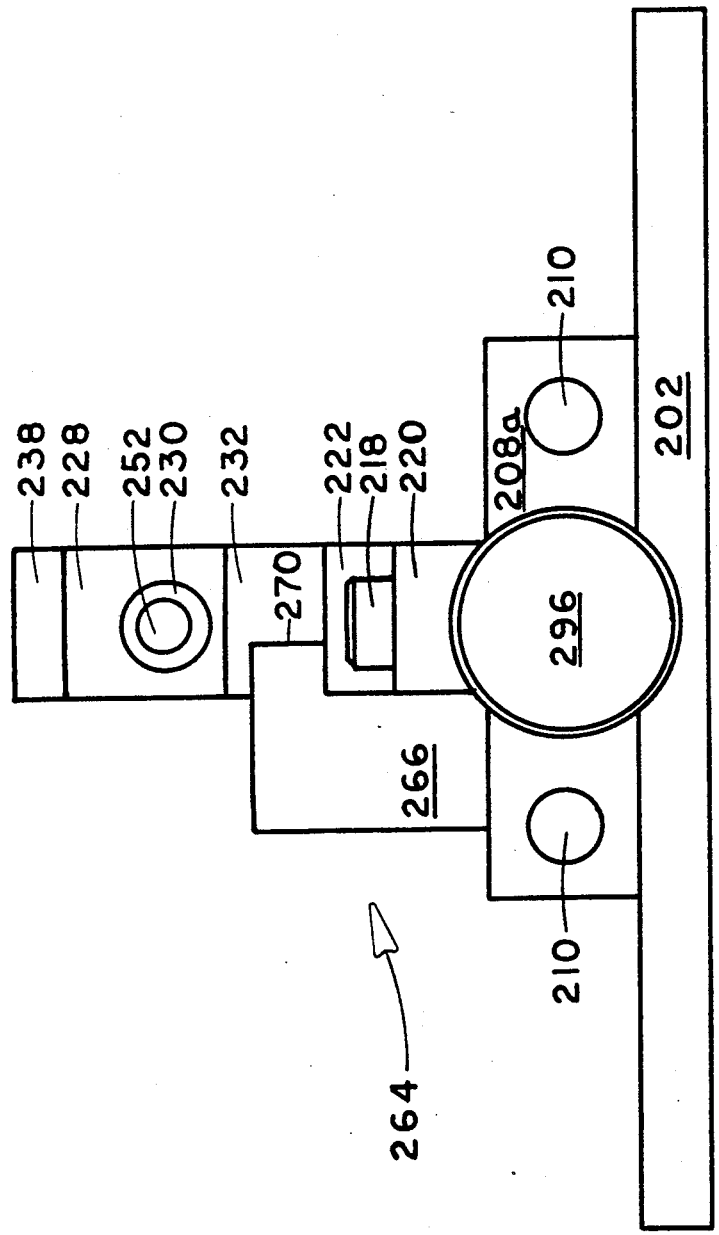

METHOD AND APPARATUS FOR ALIGNING A LASER DIODE, AND LASER DIODE SYSTEM PRODUCED THEREBY

This invention relates to systems that employ semiconductor laser diodes, and in particular to systems that require a collimated, focused and aimed laser beam.

RELATED APPLICATION

This application relates to patent application Ser. No. 07/524,152, filed May 16, 1990 and assigned to the assignee of the present invention.

BACKGROUND OF THE INVENTION

As described in the aforesaid patent application, the semiconductor laser diode has found application in a form which incorporates the diode, appropriate optics, and electronic driving circuitry within a unitary, modular package. A problem that has consistently been encountered in using the laser diode has been the need to achieve appropriate collimation, aiming, and frequently focusing of the beam, and methods for doing so have been quite varied.

For example, as described in the article "Header for Laser Diode," NASA Tech Briefs, April 1990, p. 16, a header package is described that incorporates a fairly extensive array of parts, including a diode housing, focus shim, diode retaining ring, collimator press-in retaining ring, course collimator, wave washer, both negative and positive fine-focus lenses, a pointing lens, and various other rings and retainers. Even so, it is asserted that the device still requires the alignment to be performed manually, in a process that can be both tedious and time consuming.

A somewhat simpler array of optical components is disclosed in U.S. Pat. No. 4,601,452 issued Jul. 22, 1986 to Rando, in which various mounting forks and diode holding blocks are employed to achieve side-to-side, up-and-down, and forward-and-back adjustments of the laser positioning, along with appropriate rotational adjustments of the laser beam relative to an aperture and an array of four lenses. Such a system, however, even though it may afford precise control of the resultant laser beam, is unduly complex and does not lend itself to final placement of the laser diode into a simple modular structure.

U.S. Pat. No. 4,541,689, issued Sept. 17, 1985 to Howard et al., discloses a laser diode pen that includes just three lenses and, although the method of aligning that system is not indicated, the specification does describe an additional friction wedge which serves to compensate for misalignments resulting from physical shock or thermal expansion. Even so, this disclosure does not recognize or address the fact that the axis of the laser diode radiation pattern will typically lie at some angle to the gross mechanical axis of the diode itself. Specifically, the beam pattern emitted by the laser diode itself will be found to be oriented in an arbitrary manner with respect to the TO-5 structure in which the diode is mounted, and it is only the orientation of that TO-5 structure that is subject to any control by a fabricator of devices that incorporate such a laser diode.

In patent application Ser. No. 07/524,152 noted above, an even simpler system for collimating and aiming the laser beam is described. As shown in FIG. 1 herein (corresponding to FIG. 3 of said application), those processes are carried out within the laser module itself, so that the beam parameters thus established are "locked into" the final laser module product in the course of its manufacture. More specifically, a laser module 10 is constructed within metal housing 12 having a cylindrical external sidewall 14, a front end wall 16 (consisting of axially-positioned output lens 18 and an adjustable annular mounting ring 20), and a rear wall 22. Laser diode 32 and its associated heat sink 34, cap 36, diode lens 38, and the timing and drive circuitry (which need not be further described) are incorporated onto printed circuit board (PCB) 30 and integrated within housing 12 to provide a laser beam transmitted along axis 24 when a DC voltage source (not shown) is connected thereto. In the manufacture of laser module 10, laser diode 32 is first mounted onto PCB 30 and the resultant structure is then placed within housing 12. The collimating and aiming processes are achieved very simply in this device through adjustment of the relative positioning of laser diode 32 and output lens 18.

Specifically, plano-convex output lens 18 is placed with its planar surface first into a concentric central opening of lens mounting ring 20, and mounting ring 20 is also sized and externally threaded to fit into front opening 46 of housing 12. Lens 18 has a cylindrical base portion which is sized to be received in the central opening of the mounting ring, and also a frontal flange that rests on the outer surface of the mounting ring. The lens is centered in the mounting ring by visual inspection and glue is then applied thereto. The complete lens structure (corresponding to front end wall 16) is mounted within housing 12 by screwing mounting ring 20 into front opening 46.

The distance between laser diode 32 and front opening 46 is fixed such that when front end wall 16 is screwed therein, the focal plane of laser diode 32 falls within the range of travel of lens 18 (positioned within mounting ring 20). In what has been termed a "focusing" step, mounting ring 20 is moved along the direction of axis 24 until the desired condition of "focus" is exhibited by external inspection of the laser beam. Such "focusing" refers not to an actual focal point, but instead to the duplication at the target of the desired sharp laser beam image. The collimation necessary to achieve that image is accomplished by the aforesaid placement of the planar surface of plano-convex lens 18 towards laser diode 32, and coincidentally by the placement of mounting ring 20 as just indicated.

Since the output beam of laser diode 32 as manufactured is not necessarily either co-directional or coaxial with its gross mechanical axis, it is also necessary to aim the exit beam of laser light so that the laser beam axis will coincide with axis 24. That is made possible by the fact that the external threads of mounting ring 20 are made loose enough relative to the internal threads of housing 12 about opening 46 to permit introduction of a sufficient amount of tilt and offset in positioning the lens to compensate for such variation in the orientation of the laser beam. To align the beam axis with axis 24, module housing 12 is placed in a clamp and then mounting ring 20, into which lens 18 has been placed and to which a small amount of glue has been applied, is placed therein and manipulated until such coincidence is achieved. The glue is then allowed to set. (So that proper aiming of the laser beam can be established, a target region is provided some distance down a darkened tunnel from the clamp that will hold housing 12, and the target "bullseye" is positioned so that its center coincides with axis 24 of a housing that has been so clamped. The laser beam is thus "aimed" when it is made to strike within an area defined by that "bullseye.")

Although the foregoing procedure is quite simple and involves the use of a minimum of optical components, nevertheless it suffers from the same defect as characterizes the procedure described in the NASA article cited earlier, namely, it still requires the alignment to be performed manually, in a manner that can be tedious and wasteful of time. Experience has shown, in fact, that in spite of the relative simplicity of the procedure as just described, this focusing and aiming process for a single module can require, on the average, about four minutes. (Part of that time period involves waiting for the glue to dry.) A second disadvantage of this procedure is that it depends upon subjective visual inspection by a human operator, and some range of error in the degree of focus (the quality of the beam image) and in the aiming accuracy must be expected. Therefore, there is a need for a rapid and accurate method of "focusing" (as above defined) and aiming a laser beam as emitted from a laser diode, given the fact that the axis of the laser beam as such cannot be expected to coincide with the gross mechanical axis of the laser diode structure.

SUMMARY OF THE INVENTION

The present invention achieves a very rapid alignment, focusing, and collimation of the beams of laser diodes of the type that are mounted in a TO-5 structure. The process is carried out by use of an apparatus that ensures mechanical reproducibility in the placement both of the diode itself and of a tubular heat sink structure that includes a lens through which the laser beam is to be collimated. An aligned laser optic system (ALOS) is defined as the combination of the lens and heat sink structure with the laser diode. Since the lens and heat sink structure define a common axis, alignment of the axis of the laser beam with that first axis ensures that the laser beam as emitted by the ALOS will be in alignment with structures such as the laser module (or "visible laser module" (VLM TM)) previously described into which the ALOS may be placed. The invention permits assembly of the ALOS such that the desired alignment, focusing, and collimation of the laser beam can be achieved in about 45 seconds.

The mechanical reproducibility achieved by the invention derives from the manner in which the alignment apparatus is constructed. Specifically, the lens-heat sink structure must be placed into close proximity to the TO-5 heat sink, and then that TO-5 heat sink must be pressed into the lens-heat sink structure in such a way that there will occur a minimum of adjustments that could remove or displace material from either heat sink, and thereby decrease the degree of mechanical and thermal between the two. For that purpose, the apparatus comprises three main portions, i.e., an ALOS traveler that positions the lens-heat sink structure; a diode holder to align the axis of a laser diode that is placed within it; and a probe, onto the end of which that is inserted first into the diode holder is placed the TO-5 mounted laser diode. Leads are provided through the body of the probe to impress onto the laser diode the voltage necessary for its operation.

Collimation of the laser beam is accomplished by a lens mounted within the heat sink. The beam is focused by adjusting the longitudinal position of the ALOS traveler base to which is attached the heat-sink lens structure within which the laser diode is to be placed. The degree of mechanical control provided by the invention permits focusing (i.e., appearance of the desired beam image) to be accomplished by a single adjustment of that traveler base position. Alignment of the laser beam is accomplished by use of an X-Y manipulator that supports the end of the probe opposite to that which holds the diode.

BRIEF DESCRIPTION OF THE DRAWINGS

1. Exploded view of a prior art laser diode module in which the optical focusing, collimation and aiming processes are carried out manually.

2. Exploded view of an aimed laser optic system (ALOS) comprising a lens, a heat sink and a laser diode.

3. Perspective view of an alignment apparatus for carrying out the present invention.

4a. Sectional side elevation view of the left-most portion of the apparatus of FIG. 3 taken along the line 4-4'.

4b. Sectional side elevation view of the right-most portion of the apparatus of FIG. 3 taken along the line 4-4'.

5a. Sectional top plan view of that portion of the alignment apparatus of FIG. 3 that is shown in FIG. 4a, and taken along the line 5—5'.

5b. Sectional top plan view of that portion of the alignment apparatus of FIG. 3 that is shown in FIG. 4b, also taken along the line 5—5'.

Figure 4A:
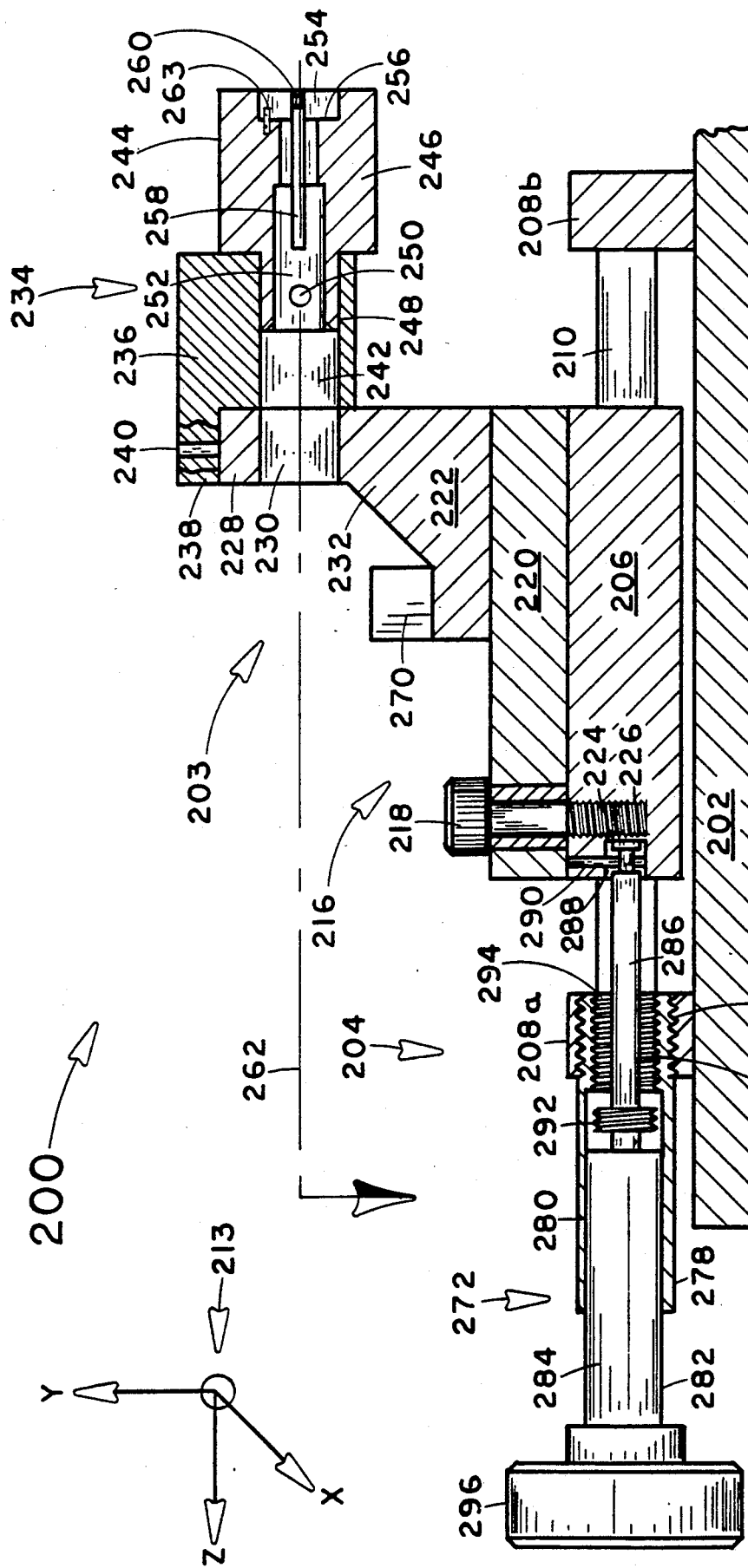
Figure 5A:
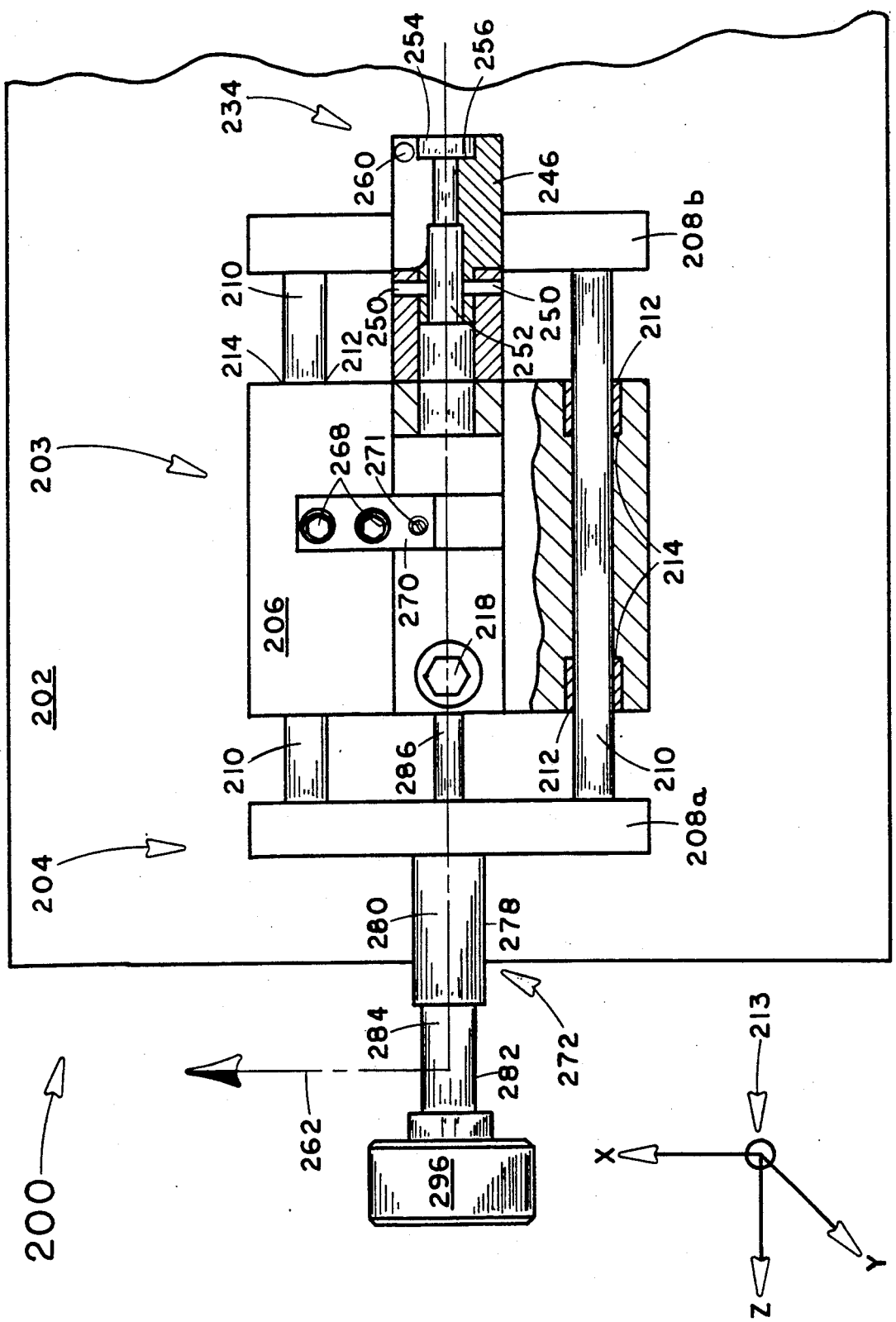

6. End elevation view of the left-most portion of the apparatus of FIG. 3 that is shown in FIGS. 4a and 5a.

Figure 4B:
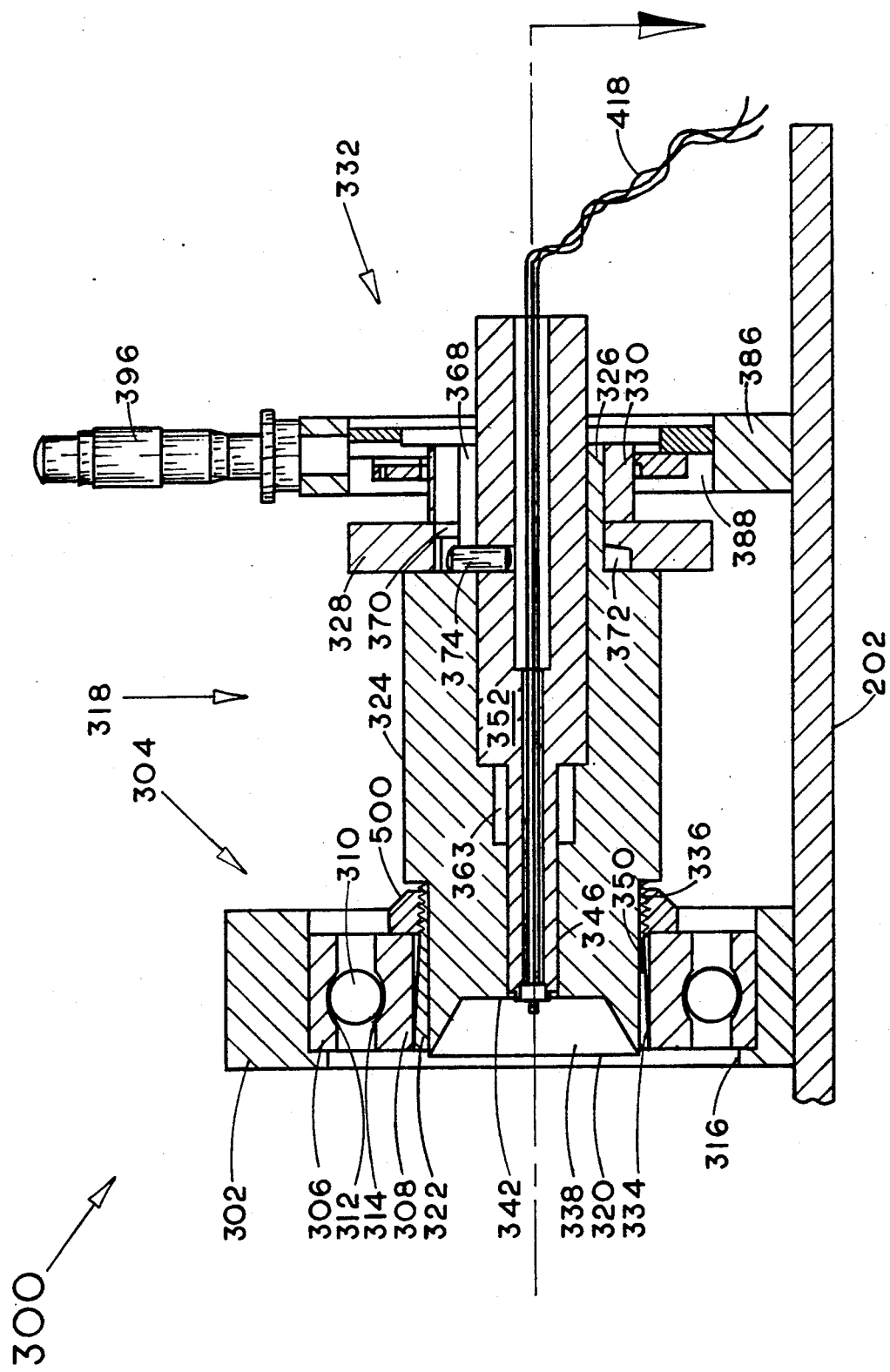
Figure 5B:
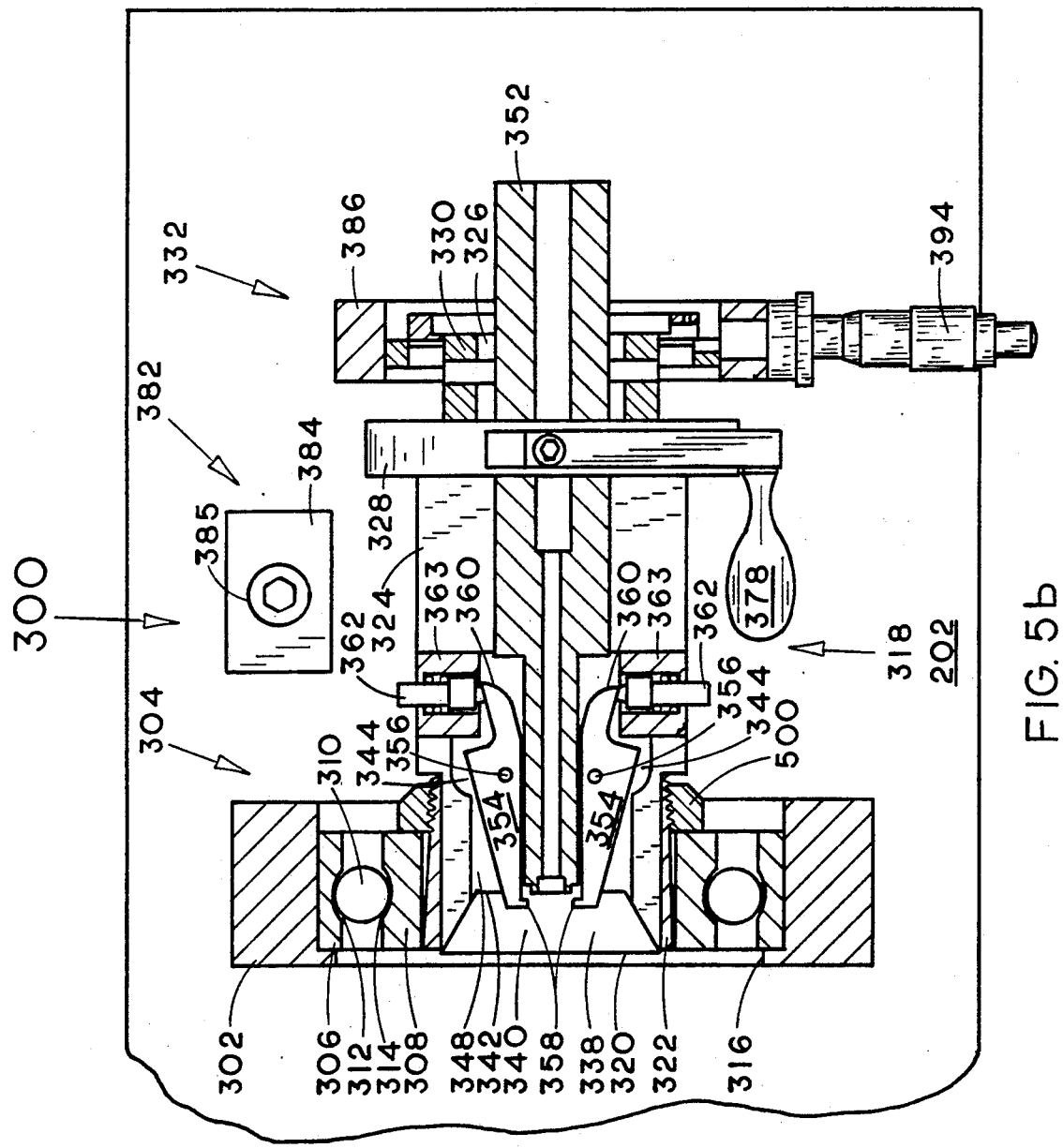

7. End elevation view of the right-most portion of the apparatus of FIG. 3 that is shown in FIGS. 4b and 5b.

Figure 7:
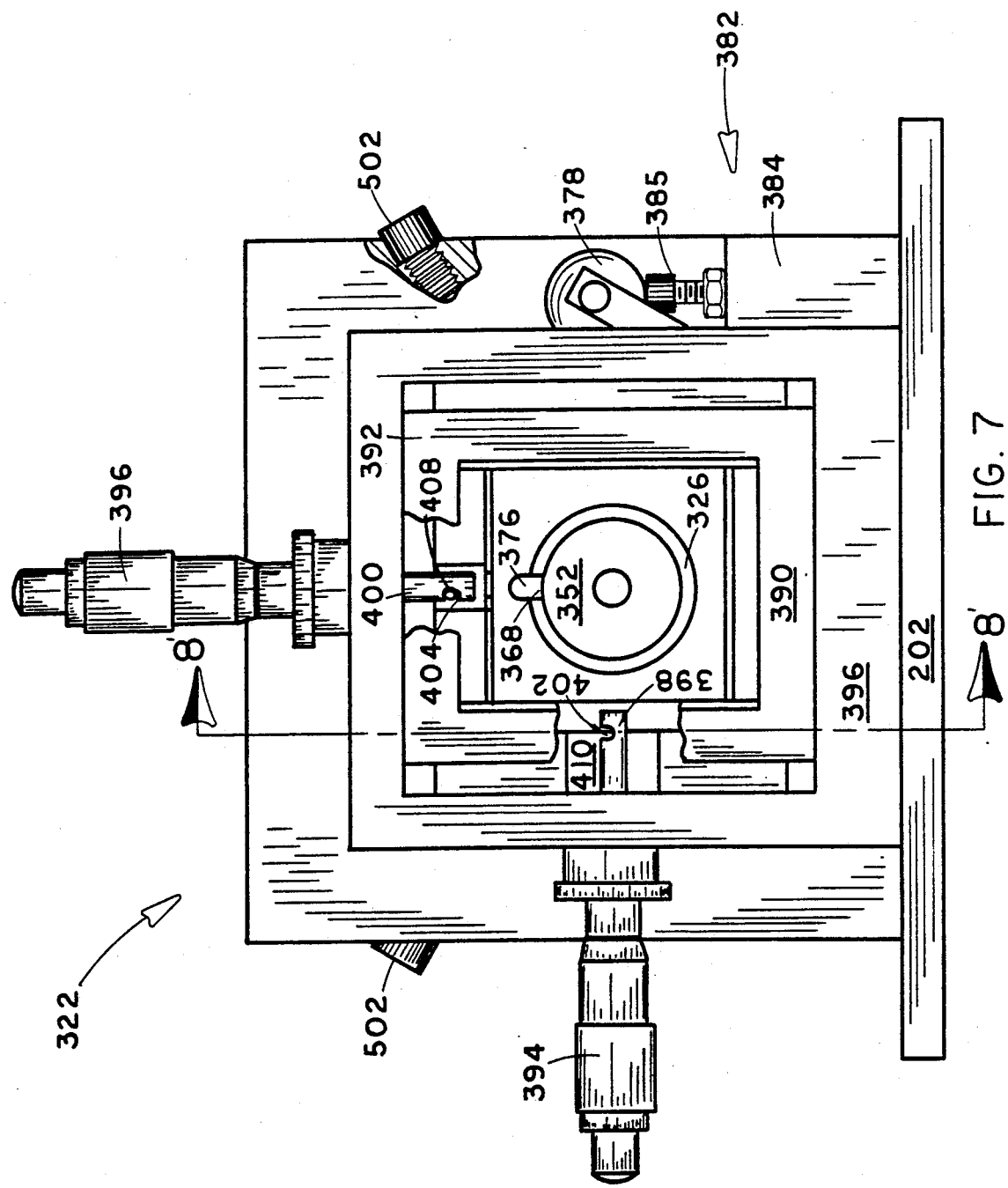

8. Sectional side elevation view, including a cutaway, of the portion of the apparatus of FIG. 3 that is shown in FIG. 7 and taken along the line 8—8' thereof.

9. Enlarged end view of diode probe showing diode mount and connector holes.

DETAILED DESCRIPTION

In operation, a diode laser generates sufficient heat to affect its own beam characteristics, and in the absence of means for transferring that heat away the laser may burn itself out. Devices that incorporate laser diodes must then provide substantial heat-sinking capacity, not only to prevent destruction of the diode, but also to help establish a lower temperature at which the operation of the laser can be stabilized. The standard TO-5 diode mount does provide a degree of heat sinking, but generally not a sufficient amount to ensure the best diode operation. At the same time, since the principal axis of the light beam produced by the laser diode will typically lie in a direction different from the gross mechanical axis of the TO-5 mount itself, means must be provided for orienting the TO-5 diode assembly within whatever structure may be used to provide the additional heat sinking required. The present method and apparatus provide such heat sinking and means for beam alignment; but unlike the procedure described in patent application Ser. No. 07/524,152 noted above, this method and apparatus correct only for the alignment of the laser beam axis, and not for any offset that may exist between the beam axis and the axis of the diode assembly.

The latter is caused by the fact that the active region of the laser diode may not lie precisely on the axis of the diode assembly. Since the extent of offset that is found in actual practice is quite small, and is largely compensated in passing through the output lens of the diode assembly, it is found that the rapid and highly repeatable alignment method of the present invention provide sufficient economic advantage for the products for which the laser assembly is intended that the continued presence of that off-axis aberration can be ignored.

Heat conduction between two objects will be enhanced if they can be placed into close physical contact, as by press fitting one within the other. Since an interference fit will force a surface of one object to slide over a surface of another, however, if maximum contact is to be maintained after the fit is made the operation must be carried out in a manner that will remove or displace as little of the material making up those objects as possible. Therefore, if the TO-5 diode structure is to be pressed into that second heat sink, the combined fit-up and alignment operation must be carried out with a minimum of adjustments that might remove or displace material from either the exterior surface of the TO-5 device or the interior surface of the heat sink. In accordance with those requirements, the initial assembly process incorporated in the present invention is shown in FIG. 2.

Figure 1:
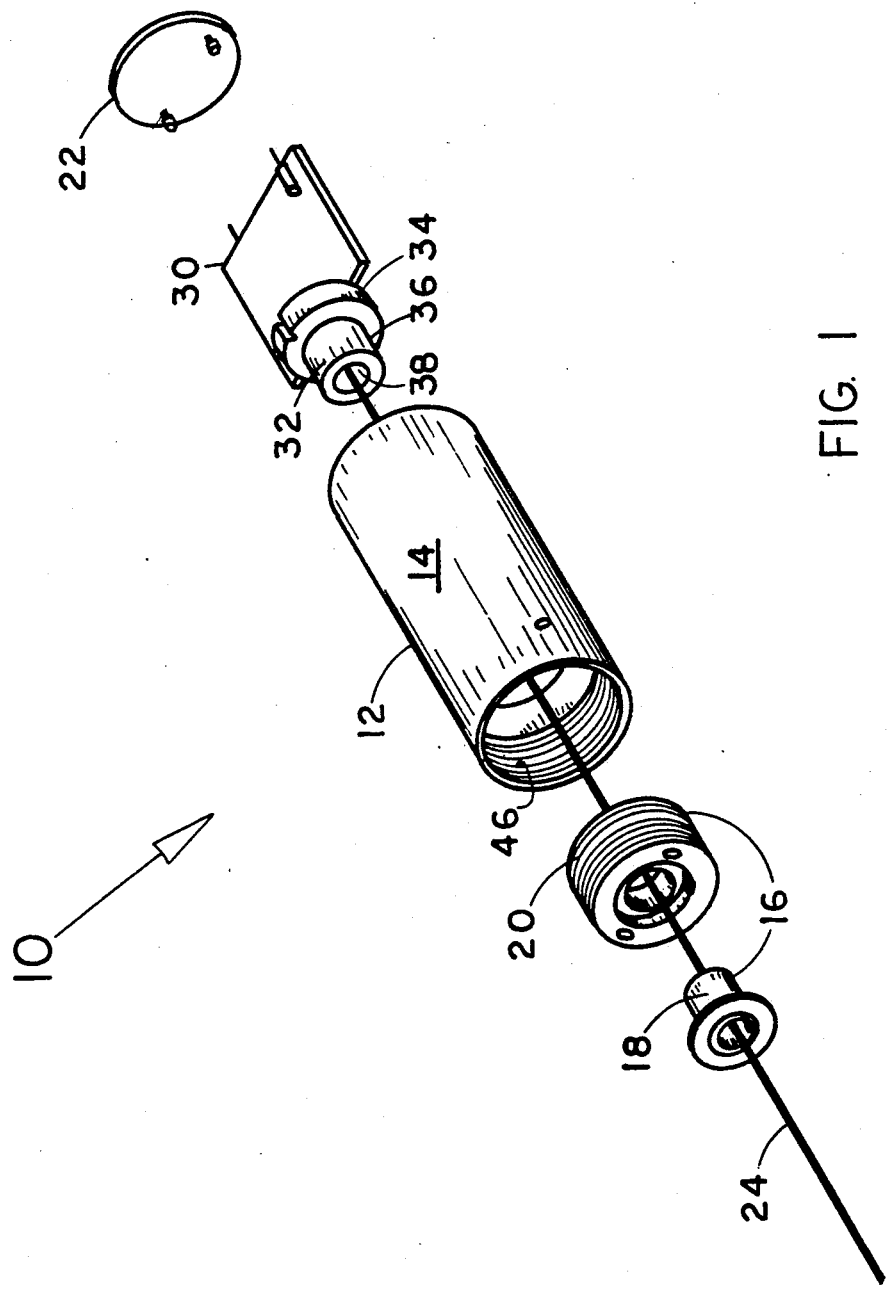
Figure 2:
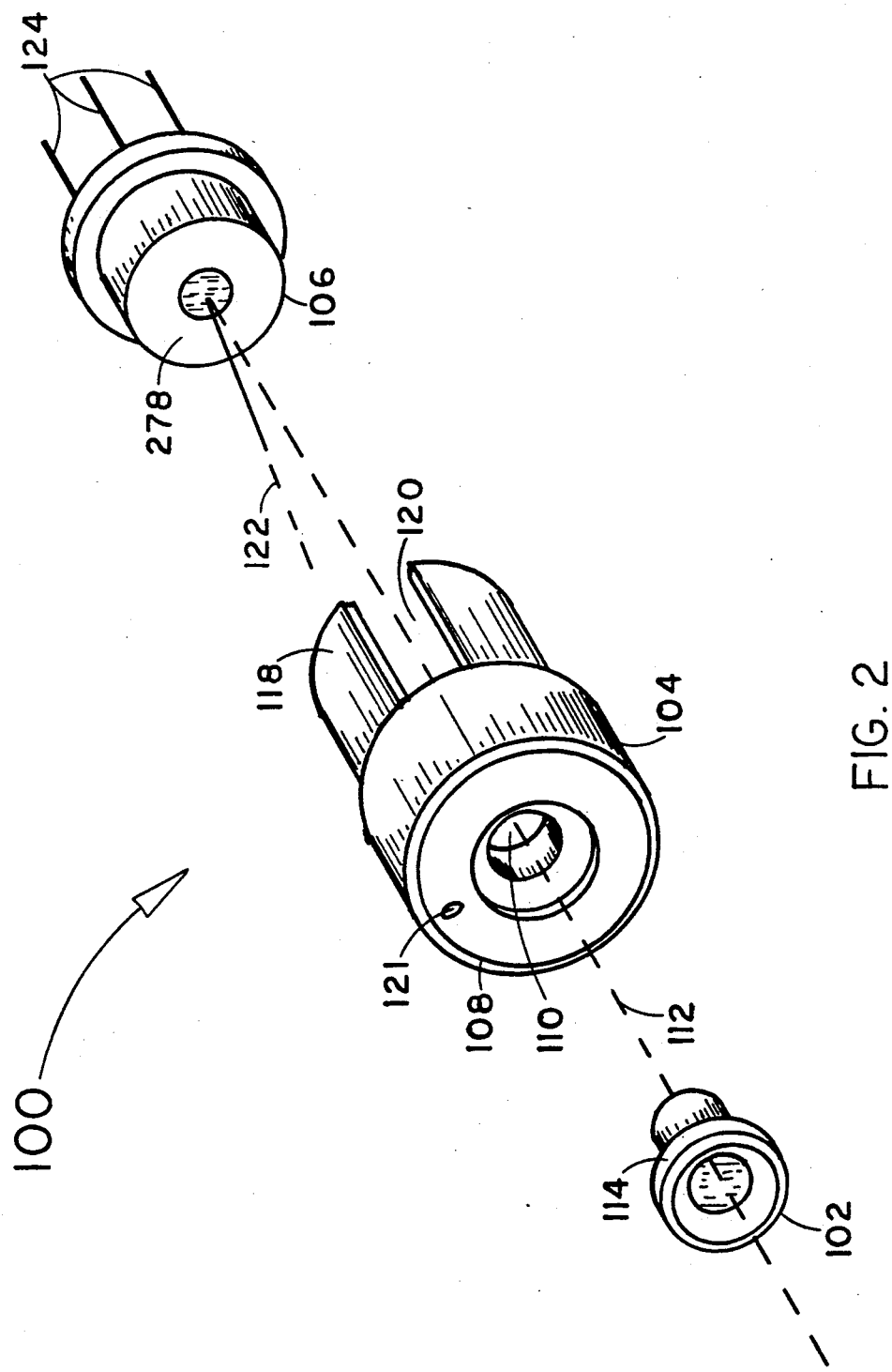

FIG. 2 is an exploded view of an aimed laser optic system (ALOS) 100 comprising a lens 102, a heat sink 104, and a laser diode 106. To assemble these components into a completed ALOS, it is necessary first to place lens 102, which in the preferred embodiment of the present invention is of a plano-convex structure, and with its planar side first, into a first side of heat sink 104, and then to place laser diode 106, which has the standard TO-5 form, into a second side of heat sink 104 opposite lens 102. Heat sink 104 includes on its first side an outer bevel 108, and a central and coaxial lens aperture 110 of a size to accommodate lens 102. Since aperture 110 is centrally located within heat sink 104, when lens 102 is placed within aperture 110 of heat sink 104, the principal mechanical axes of both lens 102 and heat sink 104 serve to define the principal axis 112 of ALOS 100. It is then an object of the assembly process to ensure that the axis of the beam emitted by laser 106 likewise lies on axis 112.

To begin the assembly of ALOS 100, lens 102 is glued planar side first into aperture 110 of heat sink 104 such that the optic axis of lens 102 will coincide with the mechanical axis of heat sink 104. Flange 114 on lens 102 provides an environmental seal when abutted against step 116 that coaxially surrounds aperture 110 of heat sink 104. Extension 118, which is located on the second side of heat sink 104 opposite the position of lens 102, also includes oppositely facing slots 120 (only one of which is shown in FIG. 2). Slots 120 permit heat sink 104 to be brought into close proximity with lens 102 in carrying out the alignment process of the present invention as described hereinafter. Heat sink 104 also includes on the side thereof holding lens 102 a location hole 121, which is positioned on a line that lies perpendicular to a line passing centrally through slots 120, and the use of which will be described below.

Figure 3:
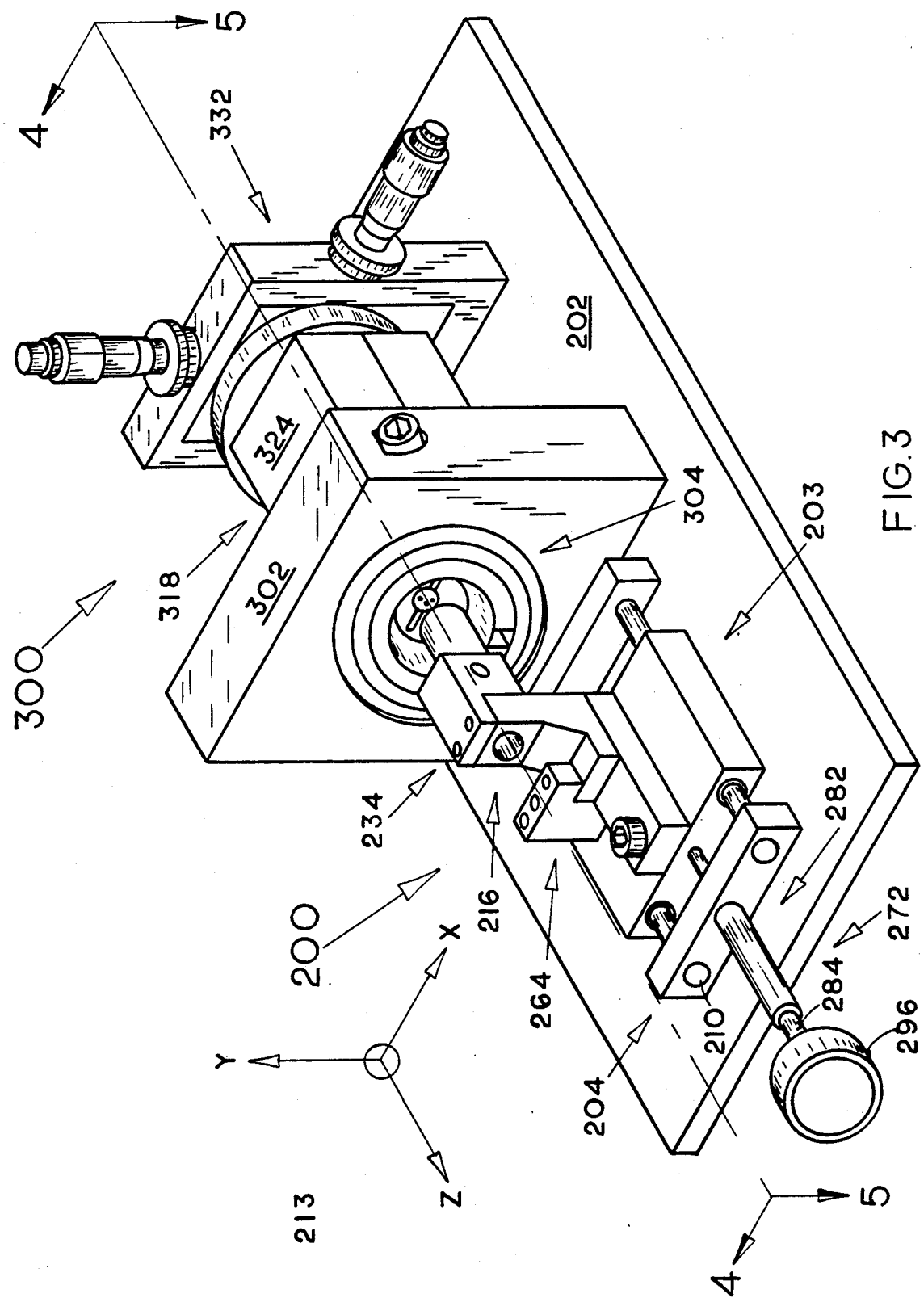

FIG. 3 is a perspective view of an alignment apparatus 200 that can be used in accordance with the invention to accomplish the desired alignment of diode 106 within ALOS 100. FIG. 4a is a sectional side elevation view of a portion of the alignment apparatus 200 of FIG. 3, and FIG. 5a is a top plan view of that same portion of apparatus 200, in which, as in all of the figures, like elements are identified by like numerals. The laser beam is aligned with the axis of ALOS 100 by adjusting the orientation of the laser relative to the lens that has already been fixed in place within ALOS 100. More particularly, it is the function of alignment apparatus 200 to achieve placement of laser diode 106 within heat sink 104, as shown in FIG. 2, in such a way that axis 122, which is the axis of the light beam emitted by laser diode 106, coincides with principal axis 112 of ALOS 100. (In FIG. 2, the deviation of beam axis 122 from ALOS axis 112 is exaggerated for illustrative purposes.)

The desired state of alignment is achieved by placing laser diode 106 into heat sink 104 under circumstances such that diode 106 will be emitting light, whereupon the center of that light beam is made to coincide with axis 112 by inspection, either directly or preferably through use of a video camera. The necessary voltage connections to diode 106 are through its standard connectors 124. The present invention also contemplates use of alignment apparatus 200 in the case of laser diodes that emit light outside of the visible spectrum, e.g., by use of an infrared-sensitive video camera when a diode 106 that emits infrared radiation is employed.

The principal structural components of alignment apparatus 200 are mounted on base plate 202. These components include ALOS traveler 203, comprising traveler frame 204 and rectangular traveler base 206, that are interconnected in part by means of parallel-facing end plates 208a and 208b mounted on base plate 202, and then by means of parallel traveler rods 210 that interconnect end plates 208 near each of their respective ends. Traveler rods 210 pass through rod apertures 212 (shown in FIG. 5a) that extend through the body of traveler base 206, whereby traveler base 206 can be moved along traveler frame 204 in a sliding fashion parallel to traveler rods 210, i.e., to the left or right in FIG. 4a or 5a, and as defined by the Z axis in coordinate system 213. Preferably, rod apertures 212 include coaxial, low-friction traveler bushings 214, and by passing traveler rods 210 through bushings 214, movement of traveler base 206 along traveler rods 210 will be more smooth and effortless.

In FIG. 4a, swing arm 216 is shown to be pivotally mounted onto the upper surface of traveler base 206 by shafted bolt 218 that threads downwardly (in FIG. 4a) into traveler base 206. More exactly, swing arm 216 comprises swing arm base 220 and swing arm stand 222 disposed on the top surface of swing arm base 220, and bolt 218 passes through swing arm base 220 into traveler base 206. To provide adequate mechanical strength to the attachment of swing arm 216 to traveler base 206, threads 224 of shafted bolt 218 will preferably extend into swing arm mounting hole 226 within traveler base 206 on the order of at least one/half inch.

In the prespective of FIG. 4a, swing arm stand 222 has the shape of a backwards letter "L", the upper portion 228 of which includes a first light aperture 230 that passes through upper portion 228 in a direction parallel to the long dimension of lower portion 232 of swing arm stand 222. Swing arm 216 further comprises ALOS mounting arm 234 that includes a main block 236 and an integral lip 238 extending outwardly therefrom. Lip 238 is attached to the top of upper portion 228 of swing arm stand 222 by any convenient means, such as by bolts 240, so as to hold main block 236 adjacent upper portion 228 of swing arm stand 222.

Main block 236 of ALOS mounting arm 234 includes a second light aperture 242 having the same diameter as that of first light aperture 230. Attachment of main block 236 of ALOS mounting arm 234 in juxtaposition to upper portion 228 of swing arm stand 222 ensures that first and second light apertures 230 and 242 are arranged coaxially.

ALOS mounting arm 234 further comprises mounting cylinder 244, which could be of a different shape, and includes main body 246 and extension 248. Extension 248 has nearly the same outer diameter as the inner diameter of second light aperture 242. Mounting cylinder 244 attaches to main block 236 of ALOS mounting arm 234 by inserting extension 248, as by a pressure fit, into second light aperture 242. Preferably, oppositely facing dowel pins 250 pass through a convenient portion of main block 236 to abut extension 248 and hold it within main block 236.

Extension 248 incorporates a third light aperture 252 that has a diameter somewhat smaller than those of first and second light apertures 230, 242, and by that smaller diameter of aperture 252 the body wall of extension 248 is made thick enough to provide sufficient mechanical strength to attach mounting cylinder 244 to main block 236 of ALOS mounting arm 234.

Third light aperture 252 also extends most of the way through main body 246. At the end of main body 246 opposite extension 248, main body 246 includes ALOS aperture 254 that is coaxial with third aperture 252 and sized to accommodate heat sink 104. Third aperture 252 is sized to be smaller than the diameter of aperture 254 so as to define shoulder 256 within the body of main body 244 against which the surface of heat sink 104 can be pressed upon its installation into aperture 254.

A selected side of main body 246 includes slit 258 extending lengthwise therein. By the somewhat limited flexibility of main body 246, slit 258 will permit a very small adjustment in the diameter of aperture 254, so that upon installation of heat sink 104 within aperture 254, screw 260, which is disposed transversely to and extending across slit 258, is used to compress together the sides of slit 258 thereby decreasing the diameter of aperture 254 and holding heat sink 104 in place.

The first step in the use of alignment apparatus 200 to align the beam of laser diode 106 with the axis of ALOS 100 consists of providing a target (not shown) on which the laser beam can be seen, either visually or preferably by use of a video camera. Alignment apparatus 200 is designed to accommodate ALOS 100 in alignments that at least include coincidence with axis 262 of apparatus 200 shown in FIGS. 4a and 5a. The "bullseye" of the target is likewise made to lie on axis 262. Once axis 112 of ALOS 100 is placed in alignment with axis 262, first by installation of heat sink 104 in aperture 254 and then by alignment of swing arm 216 with axis 262, alignment of the laser beam itself will be accomplished by adjusting the position of laser diode 106 within heat sink 104 until its beam is centered on the target "bullseye." The longitudinal (along axis 262) position of laser diode 106 relative to lens 102 is adjusted as a part of the same process so that the image of the laser beam on the target bullseye will be focused (i.e., sharp). The focusing and alignment steps may be carried out in either order or simultaneously. Therefore, with alignment apparatus 200 aligned with the target as described, the lens-heat sink combination that will comprise ALOS 100 is to be placed into ALOS aperture 254, with the end of heat sink 104 that holds lens 102 entering first, and heat sink 104 is then pressed into aperture 254 until the face of heat sink 104 that bears bevel 108 abuts shoulder 256. Location pin 263 is press fit into the face of shoulder 256 to provide a match with location hole 121 on the lens-side face of heat sink 104, thereby ensuring, for reasons hereinafter described, that slots 120 are oriented on a line that lies parallel to base plate 202.

In order to accomplish that installation, swing arm 216 must be rotated outwardly about the vertical ("Y") axis defined by shafted bolt 218 to provide access to aperture 254. Upon rotating swing arm 216 back into alignment with apparatus 200 following the installation of heat sink 104, it must be ensured that the axis of ALOS aperture 254 and hence axis 112 coincides with axis 262 of apparatus 200, i.e., in alignment with the target "bullseye." As is best seen in FIGS. 3 and 6, stop 264 limits the range of travel of swing arm 216 and return it to its position of alignment with apparatus 200. Stop 264 includes a vertical stop body 266, the side of which facing swing arm 216 is positioned such that swing arm 216, and more precisely ALOS mounting arm 234, mounting cylinder 244 and ALOS aperture 254, are returned precisely to the desired alignment with axis 262 when lower portion 232 of swing arm stand 222 encounters stop body 266 when swing arm 216 is rotated inwardly. Stop 264 is fixed by some convenient means such as screws 268 to traveler base 206.

Stop 264 also includes a stop extension 270 that extends outwardly over lower portion 232 of swing arm stand 222. The vertical length of stop body 266 is established so as to provide a tight fit between the lower surface of extension 270 and the top surface of the adjacent portion of lower portion 232 of swing arm stand 222, thereby preventing any vertical movement of lower portion 232. A detent 271 passing through extension 270 and touching the top surface of lower portion 232 prevents horizontal motion of lower portion 232. As a consequence, any loosening that may occur in the rotational connection of swing arm base 220 to traveler base 206 (through shafted bolt 218) cannot cause any variation in the positioning of swing arm 216 that would place the axis of mounting cylinder 244 and ALOS aperture 254 out of vertical (Y-direction) alignment with the target "bullseye."

In addition to ensuring that laser diode 106 is installed such that its beam axis coincides with the axis 112 of FIG. 2, the laser beam must also be focused and collimated. As beam 122 emerges from laser diode 106, it typically has a divergence on the order of 8 degrees in its parallel polarization and 33 degrees in its perpendicular polarization. As that beam enters the planar side of lens 102, it will become both focused (i.e., will form a sharp image) and collimated, provided that the distance between laser diode 106 and lens 102 is properly adjusted. Alignment apparatus 200 also provides means for accomplishing that distance adjustment.

ALOS traveler 203 further comprises traveler driver 272, as can best be seen in FIG. 4a. To accommodate traveler driver 272, end plate 208a includes driver aperture 274, which is internally threaded to receive an externally threaded portion 276 of hollow, cylindrical driver housing 278 which also includes an adjacent non-threaded portion 280 having a larger internal diameter than threaded portion 276. Driver rod 282, which passes through driver housing 278, includes a first portion 284 having a diameter sized to fit the inner diameter of non-threaded portion 280 of driver housing 278, and a second portion 286 that passes freely through both driver aperture 274 and threaded portion 276 of driver housing 278 and then into the near end of traveler base 206 at its center. Rod slot 288 near the distal end of second portion 286 of driver rod 282 is engaged by pin 290 that passes downwardly through traveler base 206 into rod slot 288, thereby connecting second portion 286 of driver rod 282 to traveler base 206 in a manner such that driver rod 282 is free to rotate about its axis.

Threaded toroid 292, which has a greater diameter than both second portion 286 of driver rod 282 and the inner diameter of threaded portion 276 of driver housing 278, encircles second portion 286 of driver rod 282 at a point within non-threaded portion 280 of driver housing 278 and serves to limit the extent of travel of driver rod 282 (and hence of traveler base 206) in the direction of end plate 208b. That is, in the free sliding movement of driver rod 282 and traveler base 206 to the right in FIGS. 4a and 5a, a point is reached at which threaded toroid 292 will abut against threaded portion 276 of driver housing 278 so that free motion in that direction is stopped. However, driver rod 282 is permitted to move further in the indicated direction by engaging threaded toroid 292 with additional, internal threads 294 of threaded portion 276. The longitudinal (Z-direction) dimensions of driver rod 282, traveler base 206 and swing arm 216 are such that when said components are moved to the point at which further motion is prohibited as just indicated, ALOS aperture 254 and hence heat sink 104 installed therein are placed in an optimum position to receive laser diode 106. That positioning is a critical aspect of the invention, since the desired positioning and alignment of laser diode 106 cannot be accomplished if the motion just indicated causes heat sink 104 to come into contact with diode 106. At the same time, heat sink 104 cannot be left by the aforesaid operation in such a position that an additional, fine adjustment in the longitudinal position of heat sink 104 would not be feasible.

At the end of first portion 284 of driver rod 282 opposite rod slot 288 there is fixed a driver wheel 296 that is conveniently employed to cause rotation of driver rod 282, whereupon the external threads of threaded toroid 292 engage inner threads 294 of threaded portion 276 of driver housing 278 so as to advance driver rod 282 further in the direction of end plate 208b. Both threaded toroid 292 and threaded portion 276 preferably have about 46 threads per inch, so that by turning driver wheel 296 the forward motion of driver rod 282 can be adjusted in very small increments, since it is that adjustment that focuses the laser beam from diode 106. The critical positioning of heat sink 104 as previously described permits that focus to be accomplished in a single step, in which wheel 296 is carefully rotated while watching the image of the laser beam on the target "bullseye," preferably by use of a video camera directed at the target, until the desired condition of focus is observed.

Alignment apparatus 200 further comprises diode holder 300, best seen in FIGS. 4b and 5b, the function of which is to position laser diode 106 for insertion into a heat sink 104 that has been positioned using ALOS traveler 203 as previously described. Holder 300 includes rectangular bearing frame 302, which is attached to base plate 202 such that the major plane of frame 302 lies in the X-Y plane of coordinate system 213, and at a distance in the Z direction from the end of swing arm 216 (in which heat sink 104 is mounted) such that heat sink 104 will be positioned a very small, preselected distance to the left (in FIGS. 4 and 5) of center of bearing frame 302 as measured in the Z direction. Bearing 304, which is generally disk shaped, is centrally mounted (in terms of both the X and Z axes of coordinate system 213) within bearing frame 302, with its major plane parallel to that of frame 302, and at a height in the Y direction of system 213 such that axis 112 of a heat sink 104 that has been positioned as indicated will pass through the Y-direction center of bearing 304.

Bearing 304 further comprises toroidally-shaped outer race 306, inside of which is located the smaller diameter but similarly shaped inner race 308, separated from outer race 306 by a plurality of ball bearings 310 that are contained within outer groove 312 on the inner circumference of outer race 306 and inner groove 314 on the outer circumference of inner race 308. Both outer groove 312 and inner groove 314 are concave in shape so as to accomodate the outer surfaces of spherical ball bearings 310, and further to permit relative motion of the major planes of outer race 306 and inner race 308. By its attachment to bearing frame 302, the major plane of outer race 306 of bearing 304 is permanently fixed in the X-Y plane of coordinate system 213, while the plane of inner race 308 is permitted to be changed for the purpose of aligning the beam of a laser diode 106 with the principal axis 112 of ALOS 100.

The Z-axis position of bearing 304 is fixed by ring-shaped holder lip 316, which is integral in structure with frame 302, and is positioned on the inner diameter thereof on the side thereof facing ALOS traveler 203 so that bearing 304 can be pressed permanently against the side of lip 316 facing into frame 302.

Diode holder 300 further comprises probe housing 318, which includes first cylindrical portion 320 that passes through locking sleeve 322 into the interior of bearing 304, a first rectangular portion 324 that extends to the right thereof (in FIGS. 4b and 5b), second cylindrical portion 326, rotating lock 328, and a second rectangular portion 330 that is mounted over the exterior of second cylindrical portion 326 at the end thereof opposite first rectangular portion 324. Second rectangular portion 330 is supported at its distal end by X-Y manipulator 332, and thus serves to provide a second support to probe housing 318, in addition to that provided by the positioning of first cylindrical portion 320 within locking sleeve 322 and the inner diameter of inner race 308.

The walls of sleeve 322 become more thin in passing outwardly from the end thereof that extends the furthest into bearing 304. Sleeve 322 also incorporates longitudinal (Z direction) slot 334, as well as threads 336 at its distal end. Slot 334 serves to permit the inner diameter of sleeve 322 to decrease in response to an external force, i.e., sleeve 322 and bearing 304, together with a locking ring that will be described hereinafter, form what is generally known as a taper lock bearing. The forward entry of first cylindrical portion 320 into sleeve 322 and the interior of inner race 308 is limited by contact of first rectangular portion 324, at its juncture with first cylindrical portion 320, with the distal end of locking sleeve 322.

First cylindrical portion 320, at the end thereof that extends into bearing 304, includes a tapered circular lip extension 338 that decreases radially in thickness to a thin edge at its outer periphery, to provide an enlarged first working space 340. Near the opposite end of first cylindrical portion 320, step 342 similarly provides a second working space 344. First working space 340 serves to permit entry of the distal end of ALOS mounting cylinder 244 and its enclosed heat sink 104 into the region within the inside diameter of bearing 304. (The purpose of second working space 344 is noted below.)

First cylindrical portion 320 further comprises a central bore 346, arm slot 348 (shown in FIG. 5b) and external guide 350. Central bore 346, which also extends a part of the way into first rectangular portion 324, serves to accommodate probe 352 to be described hereinafter. Guide 350 is a protrusion that extends outwardly from the outer surface of first cylindrical portion 320 and is aligned within slot 334 of sleeve 322 so as to prevent rotation of sleeve 322 when diode holder 300 is assembled as hereinafter described.

Diode clamp arms 354 are pivotally mounted on respective pins 356 that pass vertically (in the Y direction) through first cylindrical portion 320. Arms 354 are positioned within arm slot 348 that extends longitudinally (in the Z direction) through the body of first cylindrical portion 320. (Incorporation of step 342 to provide second working space 344 permits a greater X-axis width of arms 354 and hence greater mechanical strength in the connection of arms 354 to pins 356.) Arms 354 also extend into first working space 340 to provide oppositely facing diode hooks 358 between which a laser diode 106 is to be positioned in the course of using apparatus 200. In that process, diode hooks 358 become inserted into slots 120 of heat sink 104, thereby permitting diode 106 to be inserted into heat sink 104. Since arm slots 348 lie along a horizontal (parallel to base plate 202) line, and hooks 358 likewise lie along that line, slots 120 of heat sink 104 must similarly lie on that line in order to permit entry of diode 106 into heat sink 104, which is the reason that location hole 121 on heat sink 104 and location pin 263 on shoulder 256 within aperture 254 are used to ensure that specific orientation when placing heat sink 104 into aperture 254.

At the ends of arms 354 opposite diode hooks 358, arms 354 incorporate rockers 360 that serve to position arms 354. More specifically, the distal ends of rockers 360 are positioned against spring-loaded plungers 362 that are mounted in a convenient fashion to pass through the body of first rectangular portion 324, in parallel alignment with rockers 360 and in oppositely facing directions. (In the illustrated embodiment, plungers 362 are incorporated within plunger blocks 363 that are fixedly mounted within first rectangular portion 324.) Plungers 362 serve to press the distal ends of rockers 360 inwardly such that when the ends of rockers 360 are pressed towards each other by plungers 362, the pivotal action of pins 356 forces the diode hooks 358 at the ends of arms 354 opposite rockers 360 to move apart. The limit of that motion is established by contact between the outwardly facing edges of arms 354 and the inwardly facing limits of arm slot 348. The inwardly facing edges of rockers 360 are curved so that the entry of probe 352 between rockers 360 will force rockers 360 to move smoothly apart (against the spring forces of plungers 362) and in this case, again by virtue of the pivotal action of pins 356, cause diode hooks 358 to move together. The limit of that inward motion of diode hooks 358 is established by the presence between diode hooks 358 of a diode 106 that is to be placed in a precisely controllable and reproducible manner within heat sink 104.

At the terminus of the extension of central bore 346 into first rectangular portion 324, inner probe step 364 is defined by the terminus of major bore 366, which is concentric with but of a larger diameter than central bore 346, and extends centrally through first rectangular portion 324 from the end thereof opposite first cylindrical portion 320. Inner probe step 364 acts to limit the inward motion of probe 352 into diode holder 300.

Second cylindrical portion 326 further incorporates a longitudinal first locking slot 368 that extends from near the juncture of first rectangular portion 324 and second cylindrical portion 326 to the distal end of second cylindrical portion 326. Encircling the outer periphery of second cylindrical portion 326 is the previously mentioned rotating lock 328, which is disc shaped and includes a circular central orifice that is sized to encircle second cylindrical portion 326, thereby permitting rotating lock 328 to rotate about second cylindrical portion 326.

On its inner circumference, rotating lock 328 further includes locking notch 370 that is sized to correspond with the transverse (X direction) width of locking slot 368. Rotating lock 328 also includes tapered groove 372 that runs circumferentially around its inner diameter. Groove 372 is tapered in the circumferential direction so as to have its maximum width at the point on the circumference thereof at which locking notch 370 is located, and then to narrow circumferentially by virtue of a gradually increasing thickness of material on the side thereof adjacent second rectangular portion 330.

For the purpose of operating rotating lock 328, probe 352 includes an external locking stub 374 that, as probe 352 is inserted into probe housing 318, is made to pass through first locking slot 368 within second cylindrical portion 326, then through a second locking slot 376 that passes longitudinally through second rectangular portion 330 in parallel with first locking slot 368, and finally into locking notch 370 within rotating lock 328. When locking stub 374 has been so positioned, rotation of rotating lock 328 in the selected direction by means of handle 378 causes the width of tapered groove 372, at the point at which it faces locking stub 374, to decrease by virtue of a gradual thickening of the material of rotating lock 328 between groove 372 and the side of rotating lock 328 nearest to second rectangular portion 330. The effect of such rotation is to mechanically force probe 352 to assume a position as far inward, i.e., in the direction of bearing 304, as is permitted by the position of inner probe step 364.

More specifically, probe 352 includes on its outer periphery an outer probe step 380 by which the diameter of probe 352 increases abruptly in progressing outwardly from the end that is first inserted into probe housing 318. When the insertion of probe 352 into probe housing 318 causes inner probe step 364 and outer probe step 380 to come into contact, the insertion can proceed no further. The effect under such circumstances of turning rotation lock 328 in the selected direction as just indicated is to force outer probe step 380 firmly up against inner probe step 364. The longitudinal (Z direction) positioning of probe 352 within probe housing 318 can thus be duplicated in a precisely controllable and reproducible manner. With reference to the earlier description of the manner in which heat sink 104 is positioned (i.e., so as to just avoid touching laser diode 106), this present description indicates the corresponding manner in which a laser diode 106 that has been mounted on the end of probe 352 is precisely positioned.

In the illustrated embodiment of the invention, the direction sense for rotation of rotating lock 328 has been selected so that when looking along the Z axis from X-Y manipulator 332 towards bearing 304, clockwise rotation of rotating lock 328 aligns locking notch 370 precisely with first and second locking slots 368, 376, so that locking stub 374 may pass therethrough as previously described. The reproducibility of that position is ensured by lock stop 382 (shown in FIG. 5b), which comprises vertical lock post 384 and lock stop screw 386 that passes vertically into lock post 384. Lock stop 382 is mounted on base plate 202 in alignment with handle 378 so that by such clockwise rotation, handle 378 and lock stop screw 386 come into physical contact and further rotation of handle 378 in that direction is precluded. The precise vertical positioning of lock stop screw 385 is adjusted so that at the time such contact is made, locking notch 370 is precisely aligned with first and second locking slots 368, 376 as indicated.

X-Y manipulator 332 incorporates an X-Y frame 386 that is positioned on base plate 202 at a longitudinal (Z direction) position with respect to bearing 304 that will allow second rectangular portion 330 to reach therethrough. X-Y frame 386 is rectangular in cross-section, and incorporates therewithin a symmetric rectangular aperture 388 through which second rectangular portion 330 may pass. The precise longitudinal (Z direction) position of second rectangular portion 330 within aperture 388 is not essential to the invention, it being required only that second rectangular portion 330 must pass far enough through aperture 388 so that it can be held therein for X, Y positioning.

Second rectangular portion 330 is gripped within aperture 388 by two tightly fitting rectangular and parallel-facing frames 390, 392 that are in turn connected to X, Y position micrometers 394, 396 in a manner to be described hereinafter. Rectangular frame 390 is sized to fit fairly tightly within aperture 388 in the vertical (Y) direction, but has a width that is substantially less than the width of aperture 388 in the horizontal (X) direction. X-position micrometer 394 extends through a vertical side (i.e., the left side in FIG. 7) of X-Y frame 386 and is connected to the facing side of rectangular frame 390 in order to be able to cause X-direction movement of frame 390. Similarly, rectangular frame 392 fits fairly tightly within aperture 388 in the X direction, but has a height that is substantially less than the Y-direction height of aperture 388, and Y-position micrometer 396 extends through the top surface of X-Y frame 386 and connects to the facing (top) side of rectangular frame 392 so as to be able to bring about Y-direction movement of frame 392.

Connection of X, Y position micrometers 394, 396 to rectangular frames 390, 392, respectively, is by means of respective micrometer shafts 398, 400, which include respective transverse shaft slots 402, 404 near the distal ends thereof. Shaft pins 406, 408 extend outwardly from the main surfaces of respective rectangular frames 392, 394 and are positioned to fit within respective slots 402, 404 to permit X, Y adjustment in the positions of frames 390, 392 and hence in the position of second rectangular portion 330 that has been placed tightly within frames 390, 392. Any such X or Y adjustments will occur independently of one another since frames 390, 392 also include respective frame slots 410, 412 that provide space for movement of one of frames 390, 392 past the contiguous shafts 400, 398 of the other of frames 390, 392, e.g., frame slot 410 within frame 390 permits X-direction movement of frame 390 past shaft 400 that is attached to Y-direction frame 392. Frames 390, 392 are thus permitted to slide past each other in position, but any adjustment in either the X position of frame 390 or the Y position of frame 392 will be transmitted entirely to second rectangular portion 330, since it is held tightly by both frames 390, 392.

As a consequence of the X, Y positioning of the distal end of second rectangular portion 330, similar positioning will necessarily occur at the distal end of probe 352 when it has been placed within probe housing 318. At the same time, since the X, Y position of the opposite end of probe 352 as so placed is fixed by the placement of first cylindrical portion 320 within inner race 308 of bearing 304, X- or Y-movement of second rectangular portion 330 and of the distal end of probe 352 will cause the principal axis of probe 352 to rotate about a fixed point at the Z-dimension center of bearing 304. The longitudinal (Z direction) dimensions of probe housing 318, and in particular the length of central bore 346 as defined by the positioning of inner probe step 364, are established such that the point about which such rotation occurs falls precisely at the front lasing surface of a laser diode 106 that has been mounted on the end of probe 352.

Figure 9:
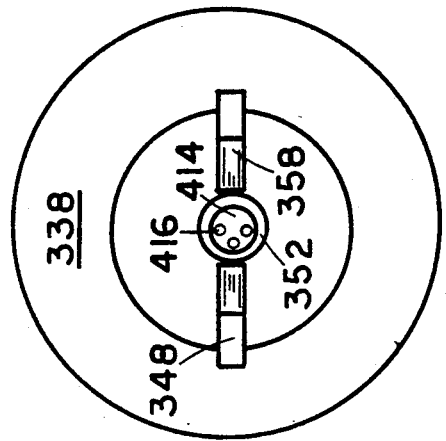
Figure 8:
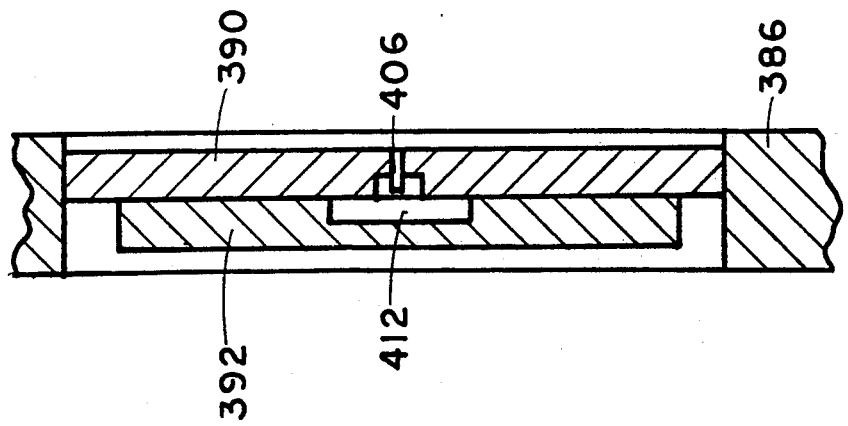

As shown in FIG. 9, laser diode 106 is mounted to the indicated end of probe 352 through diode mount 414, which contains connector holes 416 that are matched to receive connectors 124 on diode 106. Wires 418 extend from connector holes 416 through probe 352 for connection to an external power supply (not shown).

Rotation of the principal axis of probe 352 is thus equivalent to a rotation of the beam axis of laser diode 106. As noted earlier, first cylindrical portion 320 is held within inner race 308 of bearing 304, and ball bearings 310 interposed between outer groove 312 of outer race 306 and inner groove 314 of inner race 308 permit the principal plane of inner race 308 to rotate with respect to the fixed principal plane of outer race 306.

In the final assembly of alignment apparatus 200, it is necessary to leave either bearing frame 302 or X-Y frame 386 momentarily unattached to base plate 202 so that the appropriate portions of probe housing 318 may be made to pass through both of said frames. That is, first cylindrical portion 320 is made to enter bearing frame 302, and second rectangular portion 330 is made to enter X-Y frame 386, and one of said frames must be left free to move in the Z direction in order for such assembly to be possible. Because it is the positioning of first cylindrical portion 320 within inner race 308 that fixes the Z-direction location of probe housing 318, it is preferable to fix the position of bearing frame 302 first, and then to allow X-Y manipulator 322 to be moved along second rectangular portion 330 until it is properly located for attachment to base plate 202.

With bearing frame 302 fixed in place, bearing 304 is prepared for insertion therein first by inserting sleeve 322 therein, and secondly by threading locking ring 500 loosely onto threads 336 of sleeve 322. First cylindrical portion 320 is then inserted into sleeve 322, and is rotated therein until the sides of second rectangular portion 330 are properly aligned vertically and horizontally to be accepted within X-Y manipulator 322, which may then be adjusted in its longitudinal position and fixed to base plate 202 by some convenient fashion such as screws (not shown) that pass through base plate 202 enter into the bottom end of frame 386. Since sleeve 322 is tapered in its external dimension as previously described, when locking ring 500 is further tightened thereon the inner dimension of sleeve 322 is decreased, thereby exerting a clamping pressure on first cylindrical portion 320 that prohibits it both from further rotation and from any longitudinal motion. It must be ensured that at the time locking ring 500 is so tightened, first rectangular portion 324 is held tightly against the facing edge of sleeve 322, whereby the part of first cylindrical portion 320 that enters bearing 304 will be placed precisely in the desired longitudinal position.

Additionally, bearing clamp screws 502 (shown in FIG. 7) are installed through bearing frame 302 from the outside, and are caused to press against the outer surface of outer race 306 just enough to cause a small amount of distortion in the shape of outer race 306. That distortion is adjusted to an amount that is just sufficient to produce a degree of resistance to any movement of inner race 308 relative to outer race 306 that the cause of such movement, i.e., the turning of micrometers 394, 396, will require a practical degree of hand-applied force, and further that rotation of the axis of probe 352 by means of X-Y manipulator 332 as previously described will be precisely reproducible.

In the illustrated embodiment, the distance from the Z-axis center of bearing 304 to the plane of micrometers 394, 396 is 5.25 inches (13.33 cm), so that a movement of 1 millimeter (mm) of either of micrometers 394, 396 will rotate the axis of probe 352 and hence the axis of the beam emitted by laser 106 by 0.433 degrees. Vernier dials on micrometers 394, 396 include 100 divisions, hence the angular precision with which the laser beam axis can be adjusted becomes approximately 0.004 degrees. Similarly, when using the indicated thread count of 46 threads per inch in threaded parts 276 of driver housing 278 and threaded toroid 292, a rotation of driver wheel 296 of 2 degrees, for example, corresponds to a translational increment in the position of an installed heat sink 104 of 0.00012 in. (0.03 mm).

It will be obvious to a person of ordinary skill in the art that a wide range of such precision specifications can be attained by using embodiments of the invention of other dimensions, and further that a number of other variations might be made in the manner of construction and use of the invention without departing from the true spirit and scope thereof. Since the specific embodiment described is intended only as an example of and not as a limitation on the invention, the scope of the invention should be interpreted only from the following claims as read in light of the specification, and from their equivalents.

We claim:

1. An aligned laser optic system (ALOS) comprising:
   a tubular diode housing;
   a lens positioned on one side of said housing,
   a coaxial tubular extension on the side of said housing opposite said lens, said extension including two or more longitudinal slots having a size and position that will permit entry therein of a laser diode gripping mechanism; and
   a laser diode placed into said diode housing near the side opposite said lens, placement of said diode having been accomplished by passing said diode into said extension by means of said gripping mechanism.

2. The system of claim 1 wherein orientation of said laser diode within said diode housing is adjusted so that a laser beam emitted by said laser diode will point in the same direction as principal axis of the diode housing.

3. The system of claim 2 wherein said lens is of the plano-convex type.

4. The system of claim 3 wherein the planar side of said lens is placed within said diode housing facing said laser diode.

5. The system of claim 4 wherein the longitudinal position of said laser diode within said housing is adjusted so that a laser beam emitted by said laser diode will exhibit a preselected condition of focus when externally viewed.

6. The system of claim 5 wherein said diode housing comprises a heat sink.

7. A device for achieving mutual alignment of a lens and a laser diode within a diode housing, comprising:
   a traveler for holding a diode housing;
   a diode holder; and
   means for positioning said diode housing relative to said diode holder wherein said diode holder further comprises a diode probe which includes gripping means for gripping and releasing said diode laser.

8. The device of claim 7 further comprising means for adjusting angular orientation of said probe relative to principal axis of said diode holder.

9. The device of claim 8 wherein, said diode housing is tubular and includes a coaxial tubular extension having two or more longitudinal slots, said gripping means has a size and orientation as to fit within said longitudinal slots.

10. The device of claim 9 wherein said longitudinal slots comprise oppositely facing slots, and said gripping means comprises oppositely facing diode clamp arms, each said clamp arm having a diode hook at end thereof for gripping a laser diode, and said diode hooks being positioned for entry into said slots for placement therein of a laser diode.

11. The device of claim 10 wherein said diode hooks are caused to grip or release an enclosed laser diode by process of respectively inserting and removing said probe from said diode holder.

12. The device of claim 11 wherein said clamp arms include oppositely facing rockers, and said rockers are positioned within said diode holder in abutment to corresponding oppositely facing plungers mounted within said diode holder, such that upon entry into diode holder of said probe, said arms are caused to move together so that said diode hooks on the respective ends of said arms will grip a laser diode contained therebetween, and further that upon removal from said diode holder of said probe, said arms are caused to move apart whereby said diode hooks are caused to release a laser diode contained therebetween.

13. The device of claim 8 wherein said means for adjustment in angular orientation comprise an X-Y manipulator within which is positioned a distal end of said probe.

14. The device of claim 13 wherein said X-Y manipulator further comprises:
   an X-Y frame;
   an X-direction frame that is slidably mounted within said X-Y frame and is movable in the X direction;
   a Y-direction frame that is slidably mounted within said X-Y frame and is movable in the Y direction; and
   means for moving each of said X- and Y-frames.

15. The device of claim 14 wherein said moving means is characterized in that each of said X- and Y-frames is movable independently of the other.

16. The device of claim 15 wherein said positioning means comprises first and second position micrometers mounted to said X-Y frame and connected respectively to said X- and Y-frames.

17. A method for constructing an aligned laser optic system (ALOS), comprising providing a tubular diode housing having a coaxial tubular extension thereon, said extension having two or more longitudinal slots;

placing a lens into the end of said diode housing opposite the location of said extension;

placing a laser diode within an external gripping mechanism that is sized to fit within said longitudinal slots;

placing said gripping mechanism and a laser diode contained therein within said longitudinal slots of said diode housing extension;

releasing said laser diode from said gripping mechanism; and removing said gripping mechanism from said extension while leaving said laser diode within said extension.

18. The method of claim 17, further comprising the step of adjusting angular alignment of said laser diode within said diode housing.

19. The method of claim 18, further comprising the step of adjusting longitudinal position of said laser diode within said diode housing.

* * * * *